US012682962B2

(12) United States Patent
Chen et al.

(10) Patent No.: US 12,682,962 B2
(45) Date of Patent: *Jul. 14, 2026

(54) SENSE AMPLIFIER CONTROL

(71) Applicant: Taiwan Semiconductor Manufacturing Company, Ltd., Hsinchu (TW)

(72) Inventors: Chung-Chieh Chen, Hsinchu City (TW); Cheng-Hsiung Kuo, Jhubei City (TW); Yu-Der Chih, Hsin-Chu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 149 days.

This patent is subject to a terminal disclaimer.

(21) Appl. No.: 18/628,483

(22) Filed: Apr. 5, 2024

(65) Prior Publication Data

US 2024/0249780 A1     Jul. 25, 2024

Related U.S. Application Data

(63) Continuation of application No. 17/585,031, filed on Jan. 26, 2022, now Pat. No. 11,978,518.

(60) Provisional application No. 63/212,218, filed on Jun. 18, 2021.

(51) Int. Cl.
*G11C 16/28*     (2006.01)
*G11C 16/10*     (2006.01)
*H03K 19/20*     (2006.01)

(52) U.S. Cl.
CPC .............. *G11C 16/28* (2013.01); *G11C 16/10* (2013.01); *H03K 19/20* (2013.01)

(58) Field of Classification Search
CPC ......... G11C 16/28; G11C 16/10; G11C 7/065; G11C 7/12; G11C 16/32; G11C 16/24; G11C 7/08; G11C 16/0483; G11C 16/08; G11C 16/26; H03K 19/20
See application file for complete search history.

(56) References Cited

U.S. PATENT DOCUMENTS

| | | | |
|---|---|---|---|
| 5,856,748 A | 1/1999 | Seo et al. | |
| 6,307,797 B1 | 10/2001 | Fournel et al. | |
| 6,424,571 B1 | 7/2002 | Pekny | |
| 6,535,434 B2 | 3/2003 | Maayan et al. | |
| 9,530,513 B1 * | 12/2016 | Pan ..................... G11C 11/5628 | |

(Continued)

FOREIGN PATENT DOCUMENTS

| CN | 1783328 A | 6/2006 |
|---|---|---|
| CN | 101213611 A | 7/2008 |

(Continued)

*Primary Examiner* — Alexander Sofocleous
*Assistant Examiner* — James S. Wells
(74) *Attorney, Agent, or Firm* — Merchant & Gould P.C.

(57) ABSTRACT

A sense amplifier control system includes a precharge control switch configured to receive a precharge signal. A reference cell is configured to receive a reference word line signal. In a precharge phase, the control switch is controlled in response to the precharge signal to precharge the reference input node to a predetermined precharge level. In a sensing phase subsequent to the pre-charge phase, the trigger circuit is configured to output a triggering signal at the output terminal in response to the reference input node reaching a triggering level.

20 Claims, 6 Drawing Sheets

(56) References Cited

U.S. PATENT DOCUMENTS

| | | | |
|---|---|---|---|
| 9,685,209 | B1 | 6/2017 | Dhori et al. |
| 11,227,651 | B2 | 1/2022 | Banerjee et al. |
| 11,978,518 | B2 | 5/2024 | Chen et al. |
| 2021/0158855 | A1 | 5/2021 | Banerjee et al. |

FOREIGN PATENT DOCUMENTS

| | | | |
|---|---|---|---|
| CN | 104541329 A | 4/2015 |
| CN | 106205713 A | 12/2016 |
| CN | 107305780 A | 10/2017 |
| KR | 10-2004-0006820 A | 1/2004 |

* cited by examiner

SENSE AMPLIFIER CONTROL

CROSS REFERENCE TO RELATED APPLICATION

This application is a continuation of Ser. No. 17/585,031, filed on Jan. 26, 2022, which claims the benefit of U.S. Provisional Patent Application No. 63/212,218, filed on Jun. 18, 2021, which is incorporated by reference in their entirety.

BACKGROUND

Integrated circuit memory devices typically include an array of memory cells that each store data signals representing one or more bits of data. Access to the memory cells may be controlled during read and write operations by selectively connecting the cell to bit lines in response to a received word line signal. In a read operation, for example, the bit lines may be precharged to a predefined voltage level. When the word line is enabled, a sense amplifier connected to the bit lines senses and outputs the stored data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
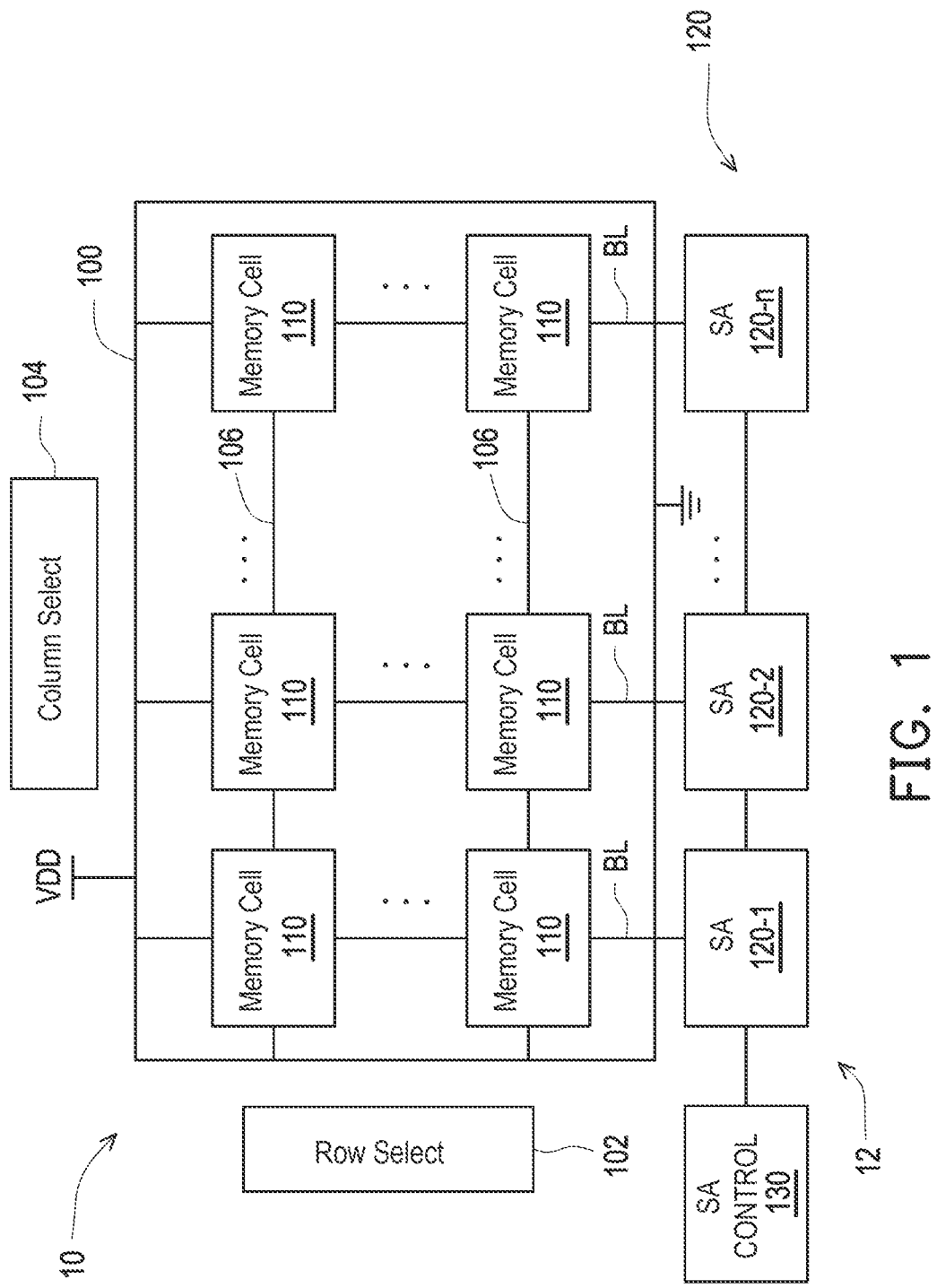
FIG. 1 is a block diagram illustrating an example of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit memory devices typically include an array of memory cells that each store data signals representing one or more bits of data. Access to the memory cells may be controlled during read and write operations by selectively connecting the cell to bit lines in response to a received word line signal. In a read operation, for example, the bit lines may be precharged to a predefined voltage level. When the word line is enabled, a sense amplifier connected to the bit lines senses and outputs the stored data.

For certain types of memory cells, the bit lines are connected to input nodes of sense amplifiers of corresponding input/output (IO) circuits. Such sense amplifiers include an inverter and a latch circuit. A DC reference current is used to precharge the sense amplifier input node (i.e. the bit line) of a corresponding memory cell to the predetermined voltage level (e.g., VDD) during a precharge phase. In a sensing phase subsequent to the precharge phase, word line signal goes high and the input node voltage level VIN (i.e. the bit line voltage) increases if the data signal stored in the memory cell is logic 0, and decreases if the data signal is logic 1. If VIN is greater than a threshold voltage level, the output of the inverter will be logic 0. If the VIN is less than the threshold voltage, the output of the inverter will be logic 1 and the output of the inverter is latched as the data output signal. Inverter circuits used in such conventional sense amplifiers include a PMOS transistor and an NMOS transistor and as such, consume additional power during sensing because the operation of the inverter uses DC current as well in addition to the DC current used for precharging the bit lines.

Moreover, the latch circuit of the sense amplifier is controlled by a timer circuit. To sense and latch the data signal by the sense amplifier, sufficient time must be allowed for the data signal to fall below the threshold voltage (in the case of logic 1), and the rate at which the bit line voltage falls may vary among the IO circuits. Accordingly, the latching timing needs to correspond to the IOs having the slowest rates during the sensing stage, otherwise some IOs may not properly latch the VIN signal. However, for IOs having faster rates (i.e. VIN falls below the threshold level well before the timer), power is consumed unnecessarily.

Thus, for convention IO circuits both the latch and the timer of the sense amplifier require DC current and consume power. For large or "wide" memory arrays (e.g. arrays having over 256 columns), power consumption can be significant.

In accordance with aspects of the present disclosure, a sense amplifier control system is provided that controls the latching timing of all of the sense amplifiers for a memory array based on a reference signal generated by a reference cell, rather than using a timer. This facilitates an IO system where DC current used during a read precharge phase is reduced or eliminated. Further, DC current used during much of a read sensing phase is greatly reduced. This results in decreased power consumption for the memory device, particularly for memory devices having a wide IO.

In some disclosed examples, data is stored in memory cells of a memory array. The memory cells are coupled to IO circuits via bit lines. A sense amplifier control circuit is coupled sense amplifiers of the IO circuits, and has a reference cell configured to generate a reference signal. The sense amplifier control circuit outputs a trigger signal to the sense amplifiers in response to the reference signal, and the sense amplifiers latch the data signals in response to the trigger signal. Thus, the sense amplifiers latch the data signals based on the trigger signal output by the sense amplifier control circuit, rather than based on a timer. Accordingly, the timer circuit (and the DC current consumed thereby) is eliminated. This allows operating the sense amplifiers only as long as is needed to sense and latch the data signals, rather than for an entire time period determined by the timer circuit. This further reduces power consumption of the device.

FIG. 1 is a block diagram illustrating an example of a memory device 10 in accordance with some embodiments. In the example shown, the memory device 10 includes a memory array 100, which has a plurality of memory cells 110. The memory cells 110 are coupled to bit lines BL, and data can read from and written to the memory cells 110 via the bit lines BL. The bit lines BL are further connected to an IO system 12 that includes a plurality of sense amplifiers 120 connected to respective bit lines BL. The IO system 12 further includes a sense amplifier control circuit or controller 130 that has an output terminal connected to each of the sense amplifiers 120.

The memory cells 110 of the memory cell array 100 are arranged in rows, each of which has a corresponding word line 106, and columns, each of which has a corresponding bit line BL. Each memory cell 110 stores 1-bit data, though other examples may employ multi-bit memory cells. The memory cell array 100 may be implemented to have a single-layer array structure (i.e. two-dimensional array structure) or a multi-layer array structure (i.e. a vertical or stack-type three-dimensional array structure).

The memory device 10 further includes a row selector 102, and a column selector 104. The row selector circuit 102 is configured to perform selecting and driving operations on rows of the memory cell array 100, including outputting WL control signals to the memory cells 110. The column selector circuit 104 is configured to select columns of the memory cell array 100 during reading/programming operations. The row selector 102 and column selector 104 may be controlled by control logic in response to received memory addresses. During a read operation, for example, WL control signals are output to a selected row of the memory array 100, and data bits stored in the memory cells 110 of the selected row are output to the corresponding bit lines BL. The sense amplifiers 120 receive the data bits output to their corresponding bit lines BL, and sense and latch the data accordingly. In FIG. 1, only two rows and three columns are illustrated for simplicity. The sense amplifiers 120 include sense amplifiers 120-1, 120-2 . . . 120-$n$ corresponding to the corresponding columns of the illustrated array 110.

As will be discussed further below, rather than controlling the sense amplifiers 120 by a timer, the sense amplifier control circuit 130 outputs a trigger signal to each of the sense amplifiers 120, which senses and latches the received data in response to the trigger signal received from the sense amplifier control circuit 130.

In some examples, the memory cells 110 are nonvolatile memory cells, and as such are capable of retaining data even after power is removed. In other examples, the memory cells may be volatile memory cells. In some examples, the memory cells 110 illustrated herein are flash memory cells, though other types of memory cells such as one time programmable (OTP) memory cells, multi time programmable memory (MTP) cells, resistive random access memory (RRAM) cells, magnetic random access memory (MRAM) cells, etc. are within the scope of this disclosure.

In some embodiments, the flash memory cells 110 are implemented using a floating gate MOS transistor device. A floating gate MOS transistor device includes a floating gate that is formed between a control gate and the channel region (the substrate) of the MOS device and at least partially vertically aligned with the control gate. Charge storage on the floating gate determines the stored data state ("0" or "1") of the memory cell.

In a flash memory cell implemented using a floating gate MOS device, programming or writing data to the memory cell is accomplished by transferring charge carriers from the semiconductor substrate (the source or the drain) to the floating gate by tunneling through the thin gate oxide layer. Typically, a block of flash memory cells is first erased by applying bias conditions to remove the charges stored on the floating gate. Then, the flash memory cells can be written or programmed by applying the bias conditions opposite to the erase operation.

A flash memory cell is read by applying a gate bias to the control gate and sensing the stored data state on the drain terminal of the flash memory cell, which is coupled to a corresponding bit line BL of the memory array 100. The sensing of the stored data on the bit lines BL is accomplished using the sense amplifiers 120, which compare the current on the bit line BL with a reference current. The reference current may be generated using a reference cell having the same construction as the flash memory cell 110 in the memory array 100.

Figure 2:
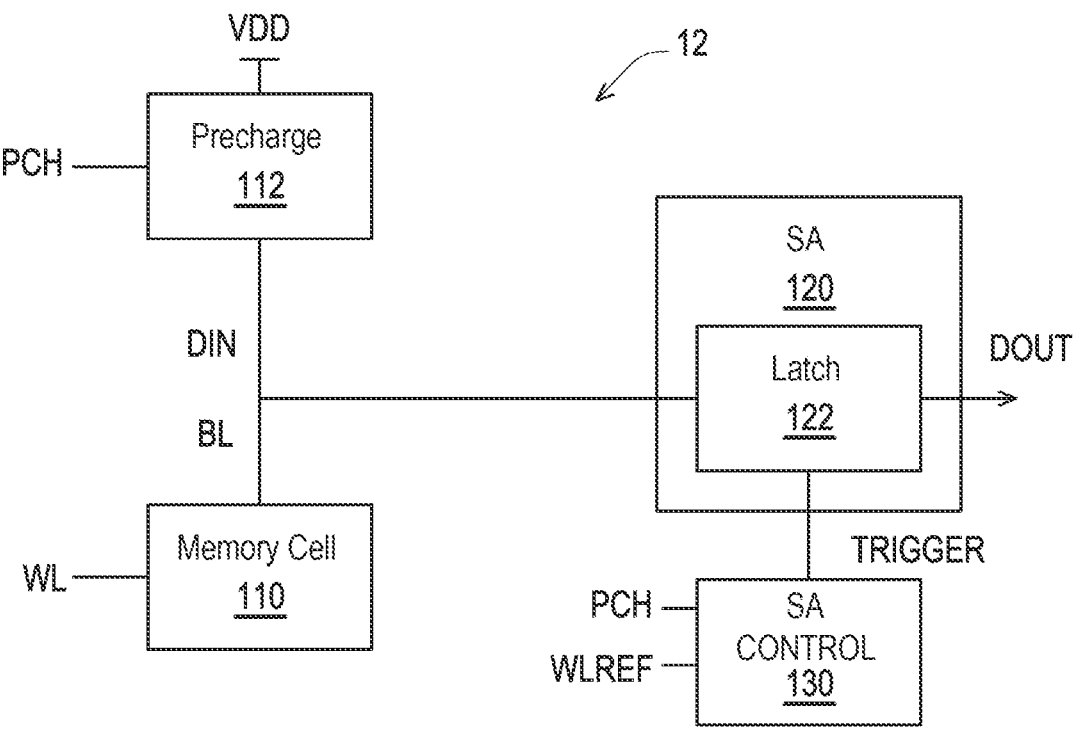
FIG. 2 is a block diagram illustrating further aspects of the memory device of FIG. 1 in accordance with some embodiments.

FIG. 2 illustrates further aspects of an example of the IO circuit 12 of the memory device 10 shown in FIG. 1. In the embodiment shown in FIG. 2, a data precharge control switch 112 is connected to the memory cell 110 at a data input node DIN (i.e. the bit line BL). The data precharge switch 112 is configured to connect the memory cell 110 to a power input terminal and precharge the data input node DIN to a predetermined voltage level (e.g. VDD) in response to a precharge signal PCH received at its control terminal. The particular memory cell 110 is selected and outputs data in response to a received word line signal WL.

The sense amplifier 120 is coupled to the data input node DIN (i.e. bit line BL) and has a latch circuit 122 configured to latch the data signal from the memory cell 110 received on the bit line BL. The sense amplifier control circuit 130 is coupled the sense amplifier 120 and also receives the precharge signal PCH as well as a reference word line signal WLREF, discussed further below. The sense amplifier control circuit 130 outputs a trigger signal to the latch circuit 122 of the sense amplifier 120, and the sense amplifier is configured to latch the data signal in response to the trigger signal.

Figure 3:
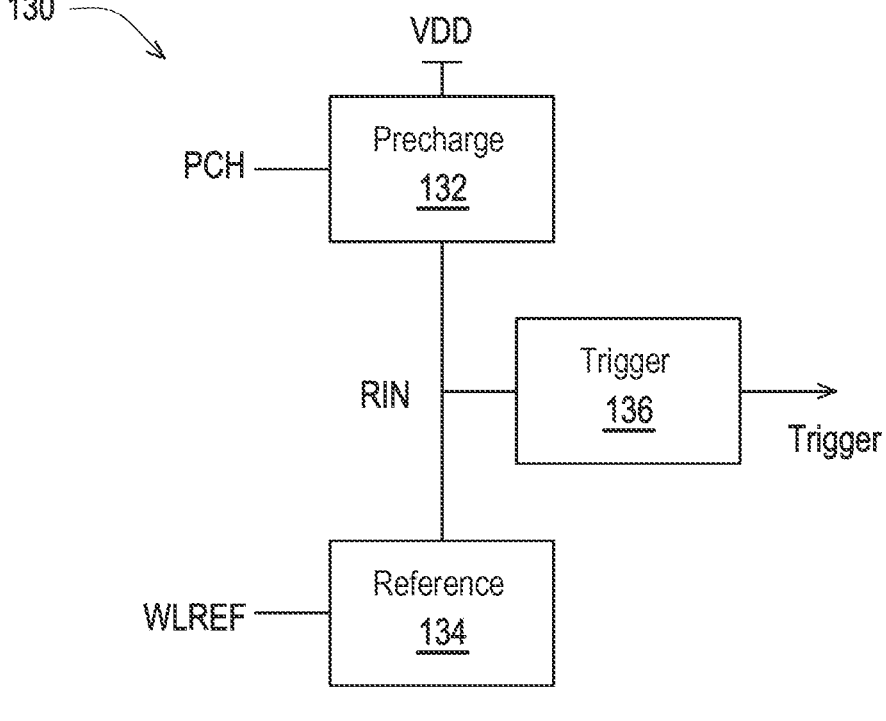
FIG. 3 is a block diagram illustrating aspects of a sense amplifier control circuit in accordance with some embodiments.

FIG. 3 illustrates aspects of an example of the sense amplifier control circuit 130. The sense amplifier control circuit 130 includes a precharge control switch 132 having a control terminal coupled to receive the precharge signal, which in some examples is the same precharge signal PCH received by the data precharge circuit 112 that is connected to the memory cell 110. The precharge control switch 132 is connected to a reference cell 134 at a reference input node RIN. The reference cell 134 is configured to generate a reference current in response to a received reference word line signal, and in some examples is structured similarly to the memory cell 110. A trigger circuit 136 has an input terminal coupled to the reference input node RIN and an output terminal that outputs the trigger signal to the sense amplifier 120.

In a precharge phase, the precharge control switch 132 is controlled in response to the precharge signal PCH to precharge the reference input node RIN to a predetermined precharge level, such as VDD, by connecting the reference cell 134 to the VDD power input terminal. In a sensing phase subsequent to the pre-charge phase, the trigger circuit 136 outputs the triggering signal to the sense amplifier 120 in response to the reference input node RIN reaching a triggering level, discussed further below.

Figure 4:
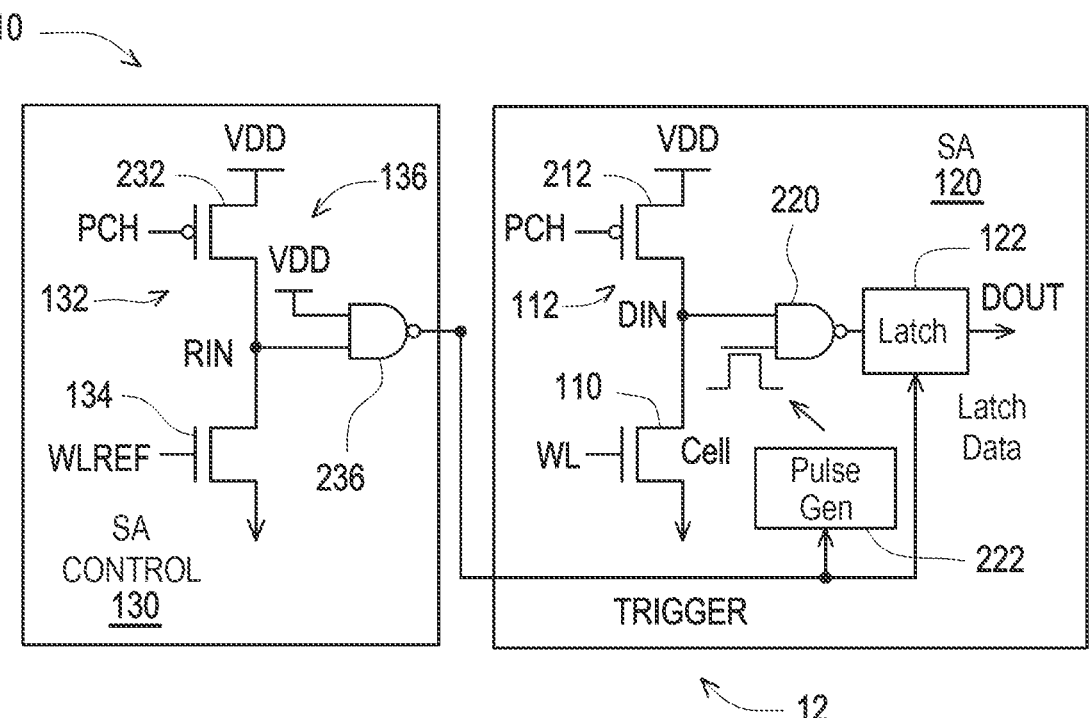
FIG. 4 is a schematic diagram illustrating an embodiment of a sense amplifier control system and sense amplifier in accordance with some embodiments.

FIG. 4 illustrates further aspects of the memory 10, showing one of the memory cells 110 of the memory array 100, along with portions of an embodiment of the IO circuit 12. In the example shown in FIG. 4, the memory cell 110 is a flash memory cell configured to store one bit of data. Other types of memory cells are within the scope of the disclosure. The memory cell 110 has its gate terminal connected to receive a word line signal WL output on the word line 106 of the memory cell's 110 corresponding row. A bit line BL is coupled to the memory cell 110, such that the memory cell 110 outputs its stored data signal to the bit line BL. In the example of FIG. 4, the data precharge switch 112 includes a PMOS precharge transistor 212 that receives the precharge signal PCH at its gate terminal. Other types of precharge switches are within the scope of the disclosure. One source/drain terminal of the precharge transistor 212 is connected to the VDD terminal to receive the power input voltage signal VDD, and the other source/drain terminal of the precharge transistor 212 is connected to the memory cell at the data input node DIN (i.e. the bit line BL).

The sense amplifier 120 includes the latch 122, with a latch input circuit in the form of a NAND gate 220 connected to its input, though other configurations of the latch input circuit are within the scope of the disclosure. One input terminal of the NAND gate 220 is coupled to the data input node DIN and its other input terminal receives a pulse signal from a pulse generator 222. The latch 122 and the pulse generator 222 each receive the trigger signal from the sense amplifier control circuit 130.

The sense amplifier control circuit 130 of FIG. 4 includes the reference cell 134, which may be a reference flash memory cell with a configuration that matches the memory cell 110. The reference cell 134 has its gate terminal connected to receive the word line reference signal WLREF. The reference precharge switch 132 includes a PMOS precharge transistor 232 that receives the precharge signal PCH at its gate terminal. Other types of precharge switches are within the scope of the disclosure. One source/drain terminal of the reference precharge transistor 232 is connected to the VDD terminal and the other source/drain terminal of the reference precharge transistor 232 is connected to the reference cell 134 at the reference input node RIN.

The trigger circuit 136 includes a NAND gate 236, which has one input terminal coupled to the VDD terminal and another input terminal coupled to the reference input node RIN. As noted above, the reference cell 134 is configured to generate a reference signal, and the trigger circuit 136 is configured to output the trigger signal to the sense amplifier 120 based to the reference signal generated at the node RIN, and the sense amplifier 120 is configured to latch the data signal in response to the trigger signal.

Figure 5:
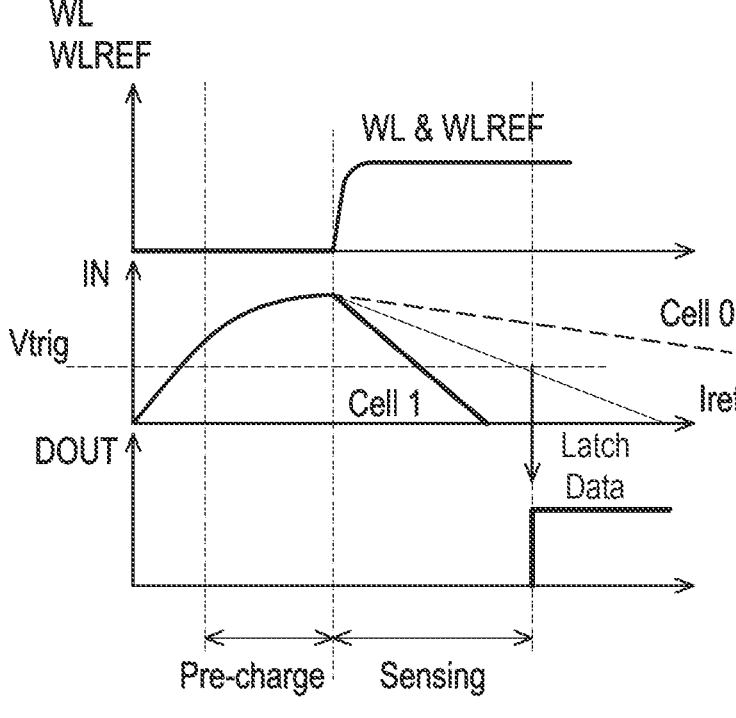
FIG. 5 is a wave diagram illustrating various signals generated by the sense amplifier control system and sense amplifier shown in FIG. 4 in accordance with some embodiments.

FIG. 5 is a wave diagram illustrating various signals generated by the memory device 10. Referring to FIG. 4 and FIG. 5, the NAND gate 236 of the sense amplifier control circuit 130 provides the trigger signal, which controls the pulse generator 222 and the latch 122 of the sense amplifier 120. A data read operation includes a precharge phase, where the word line reference signal WLREF and the word line signal WL respectively received by the reference cell 134 and the memory cell 110 are both low, or logic 0. The precharge signal PCH is also low during the precharge phase. As such, current flows through the reference precharge transistor 232 and the data precharge transistor 212, and the reference input node RIN and the data input node DIN both are charged to a high level (VDD). Thus, the NAND gate 236 receives high inputs at both of its inputs and therefore outputs a low signal. Since the trigger signal is low, the pulse signal is not output by the pulse generator 222, and the NAND gate 220 of the sense amplifier 120 receives a logic low signal at one of its inputs. Further, since the trigger signal is low the latch 122 is not enabled, and the signal output by the NAND gate 220 is not latched.

A sensing phase follows the precharge phase as shown in FIG. 5, where the word line reference signal WLREF and the word line signal WL corresponding to the selected row both go high. Current flows through both the reference cell 134 and the memory cell 110, and the reference input node RIN and the data input node DIN both begin to fall from the precharge voltage level. If the data signal stored in the memory cell 110 is logic 0, the data input node DIN voltage level falls from the precharge level at a first rate. If the data signal stored in the memory cell 110 is logic 1, the data input node DIN falls at a second rate that is greater than the first rate.

As noted above, the reference input node RIN is also pre-charged high (VDD) during the precharge phase. During the sensing phase, the reference input node RIN falls at a third rate, which is between the first speed and the second rates. The third rate at which the reference input node RIN falls from the precharge level is determined based on the configuration of the reference cell 134. More particularly, the third rate is determined by trimming the reference current Iref that flows through the reference cell 134 when the reference word line signal WLREF is asserted to be between the reference cell's 134 on current I_on and its off current I_off. In some examples, the on current I_on is 30 uA and the off current I_off is 0.5 uA, though other on/off current levels apply in other embodiments, depending on factors such as the memory cell configuration.

In the sensing phase, when the reference input RIN reaches the triggering voltage Vtrig (e.g., VDD/2), the NAND gate 236 of the sense amplifier control circuit 130 outputs the trigger signal (i.e. logic 1) to the pulse generator 222 and the latch 122 of the sense amplifier 120. The pulse generator 222 correspondingly generates the pulse signal as one input of the NAND gate 220. The other input of the NAND gate 220 is thus inverted and latched as the data output signal DOUT of the sense amplifier 120.

More particularly, if the data signal stored in the memory cell 110 is logic 0, the data input node DIN voltage level falls from the precharge level at the first rate, which is slower than the third rate of the reference signal. Thus, when the reference signal reaches the trigger level Vtrig, the data signal at the data input node DIN is still at a high level when the trigger signal is output to the pulse generator 222 and latch 122. Accordingly, the NAND gate 220 outputs a logic low signal that is latched and output as the DOUT signal by the latch 122. If the data signal stored in the memory cell 110 is logic 1, the data input node DIN falls at the second rate, which is faster than the third rate. Therefore, the data signal at the data input node DIN falls to a low level before the reference signal reaches the trigger level Vtrig, and the DIN signal input to NAND gate 220 is low when the pulse generator 222 outputs the pulse in response to the trigger signal. Accordingly, the NAND gate 220 outputs a logic high signal that is latched and output as the DOUT signal by the latch 122.

Thus, during the sensing phase, a DC current is required for outputting the data signal DOUT only for the duration of the pulse. Further, a timer is not used for controlling the latch during the sensing phase, eliminating the power that would be consumed by the timer.

Figure 6:
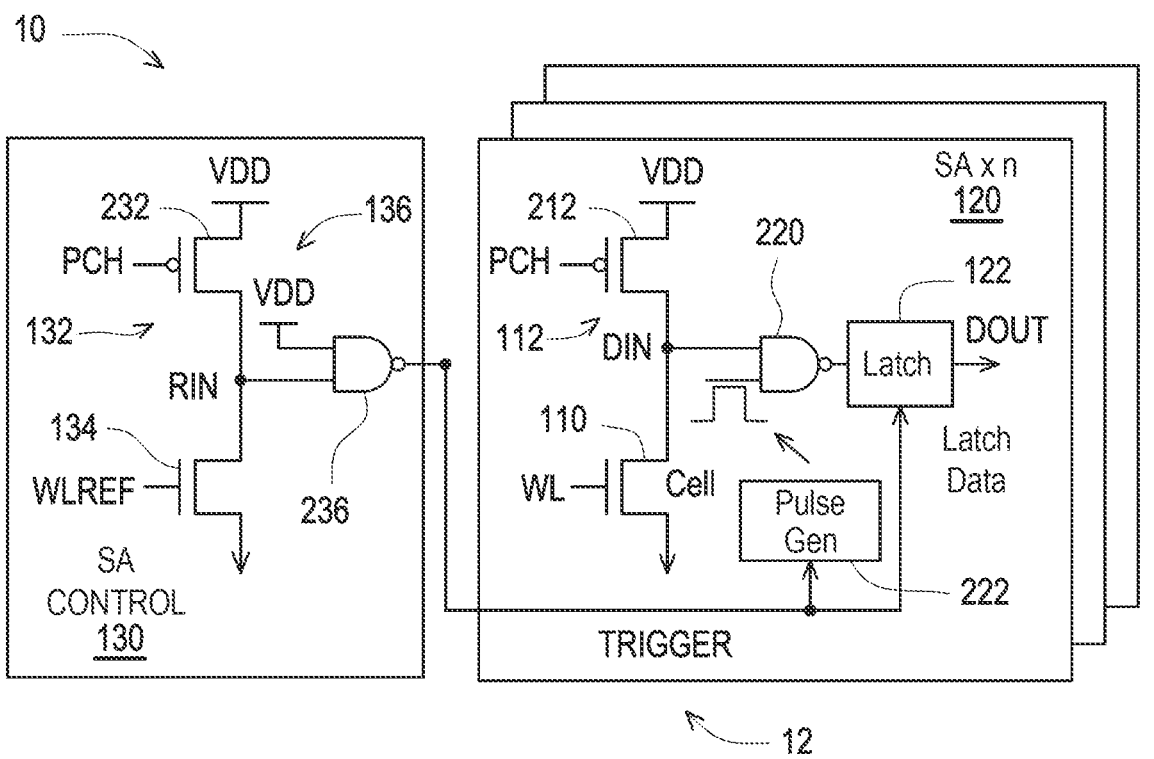
FIG. 6 is a schematic diagram illustrating the sense amplifier control system of FIG. 4 and a plurality of sense amplifiers in accordance with some embodiments.

As shown in the example of FIG. 1, the sense amplifier control circuit 130 may be coupled to a plurality of sense amplifiers 120. FIG. 6 illustrates an embodiment where the sense amplifier 130 shown in FIG. 4 provides the trigger output to n sense amplifiers (n is a positive integer). This facilitates reducing power consumed by a plurality of the sense amplifiers 120 while only adding one sense amplifier controller 130.

Figure 7:
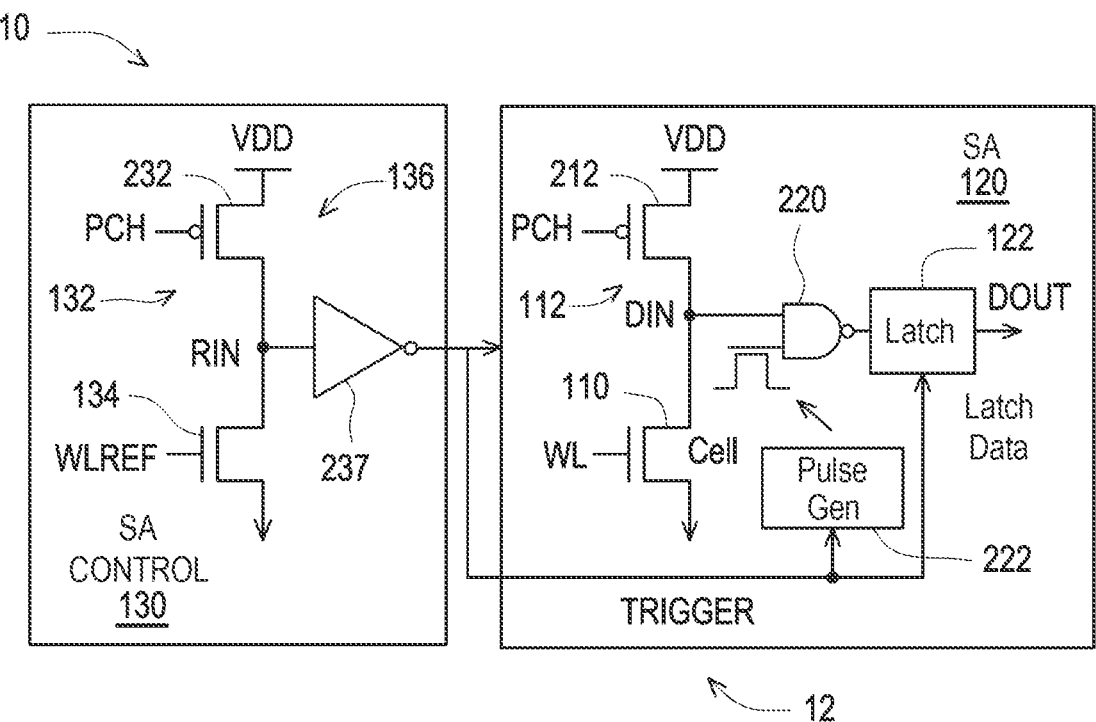
FIG. 7 is a schematic diagram illustrating another example of a sense amplifier control system and sense amplifier in accordance with some embodiments.

FIG. 7 illustrates another example where the trigger circuit 136 includes an inverter 237. The reference input node RIN is connected to the input of the inverter 237, which inverts the reference signal and outputs it as the trigger signal to the pulse generator 222 and the latch 122.

Thus, when the reference input node RIN has been precharge high during the precharge phase, the inverter 237 output is low. During the sensing phase, the reference signal at the reference input node RIN falls at the third rate, which is between the first and second rates as shown in FIG. 5. When the reference signal falls to the trigger level Vtrig, the output of the inverter 237 (i.e. the trigger signal) goes high. As with the example shown in FIG. 4, if the data signal stored in the memory cell 110 is logic 0, the data input node DIN voltage level falls from the precharge level at the first rate, which is slower than the third rate of the reference signal. Thus, when the reference signal reaches the trigger level Vtrig and the inverter 237 outputs the trigger signal, the data signal at the data input node DIN is still at a high level so the NAND gate 220 outputs a logic low signal that is latched and output as the DOUT signal by the latch 122. If the data signal stored in the memory cell 110 is logic 1, the data input node DIN falls at the second rate, which is faster than the third rate. Therefore, the data signal at the data input node DIN falls to a low level before the inverter 237 outputs the trigger signal to the NAND gate 220. Accordingly, the NAND gate 220 outputs a logic high signal that is latched and output as the DOUT signal by the latch 122.

As with the example shown in FIG. 4, DC current is required during the sensing phase for outputting the data signal DOUT only for the duration of the pulse, and a timer is not used for controlling the latch during the sensing phase, eliminating the power that would be consumed by the timer.

Figure 8:
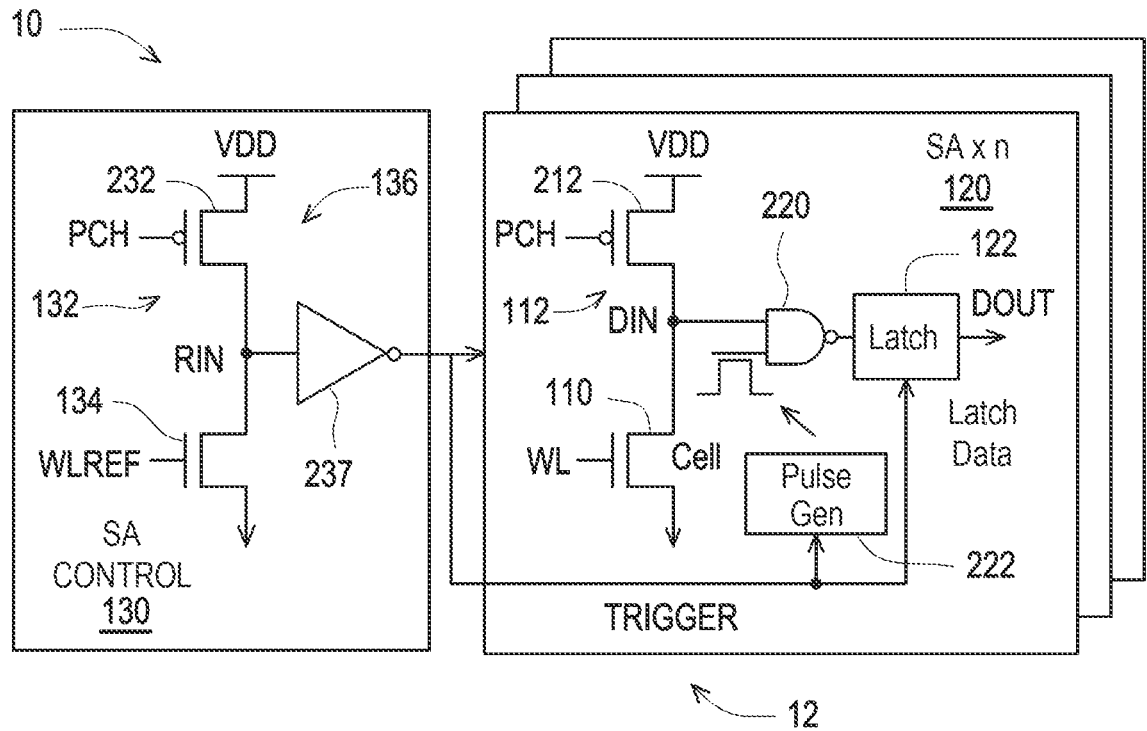
FIG. 8 is a schematic diagram illustrating the sense amplifier control system of FIG. 7 and a plurality of sense amplifiers in accordance with some embodiments.

FIG. 8 illustrates another example where the sense amplifier 130 shown in FIG. 7 provides the trigger output to n sense amplifiers. As such, the output of the inverter 237 is provided as the trigger signal to each of the pulse generators 222 and latches 122 of the plurality of sense amplifiers 120. This facilitates reducing power consumed by a plurality of the sense amplifiers 120 while only adding one sense amplifier controller 130.

Figure 9:
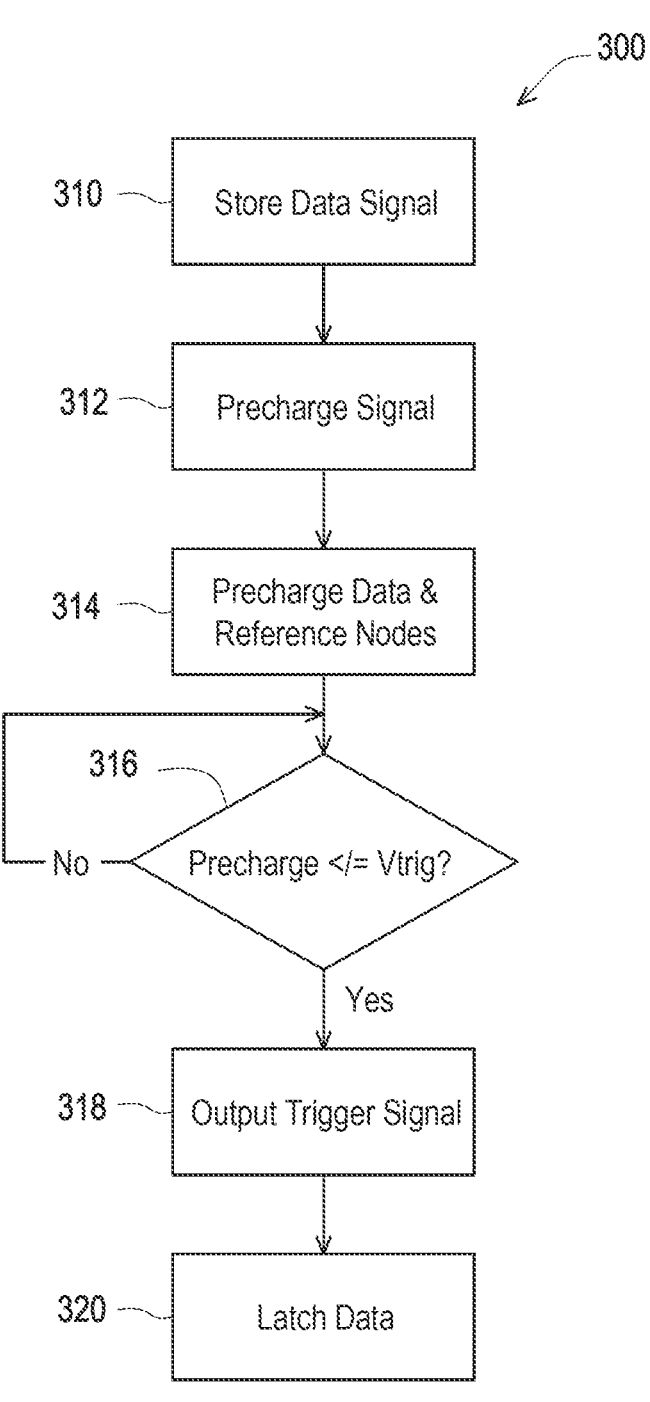
FIG. 9 is a flow diagram illustrating a method for controlling a sense amplifier in accordance with some embodiments.

FIG. 9 illustrates an example of a method 300 for sensing and latching data in accordance with disclosed embodiments. The method of FIG. 9 includes an operation 310 in which a data signal is stored in a memory cell, such as the memory cell 110 disclosed above. In operation 312, the precharge signal PCH is received by the reference precharge control switch 132/232 and the data precharge control switch 112/212. In response to the received precharge signal, the reference input node RIN of the trigger circuit 136 and the data input node DIN are precharged at operation 316. In some examples, the reference input node RIN and the data input node DIN are pre-charged to the VDD voltage level. After pre-charging, at operation 316 the precharge signal is compared to a trigger level Vtrig. If the precharge signal at the reference input node RIN has fallen from the predetermined precharge level (e.g. VDD) to the triggering level Vtrig, a triggering signal is output to the sense amplifier 120 that operation 318. Based on the triggering signal, the data signal is latched by the sense amplifier 120 at operation 320.

Disclosed examples thus include a sense amplifier control system that controls the latching timing of one or more the sense amplifiers for a memory array based on a reference signal generated by a reference cell, rather than using a timer. This facilitates an IO system where DC current used during a read precharge phase is reduced or eliminated. Further, DC current used during much of a read sensing phase is greatly reduced. This results in decreased power consumption for the memory device, particularly for memory devices having a wide IO.

In accordance with some disclosed examples, a sense amplifier control system includes a precharge control switch having a first terminal, a second terminal and a control terminal. The control terminal is configured to receive a precharge signal. A reference cell has a first terminal, a second terminal and a control terminal, and the control terminal is configured to receive a reference word line signal. The first terminal of the reference cell is coupled to the second terminal of the control switch at a reference input node. A trigger circuit has a first input terminal and an output terminal. The first input terminal of the trigger circuit is coupled to the reference input node. In a precharge phase, the control switch is controlled in response to the precharge signal to precharge the reference input node to a predetermined precharge level. In a sensing phase subsequent to the pre-charge phase, the trigger circuit is configured to output a triggering signal at the output terminal in response to the reference input node reaching a triggering level.

In accordance with further aspects, a memory device includes a memory cell configured to store data. A word line is coupled to the memory cell and is configured to receive a word line signal. A bit line is coupled to the memory cell and is configured to receive a data signal from the memory cell. A sense amplifier is coupled to the bit line and is configured to latch the data signal received on the bit line. A sense amplifier control circuit is coupled the sense amplifier. A reference cell is configured to generate a reference signal, and the sense amplifier control circuit is configured to output a trigger signal to the sense amplifier in response to the reference signal. The sense amplifier is configured to latch the data signal in response to the trigger signal.

In accordance with still further disclosed aspects, a method for controlling a sense amplifier of a memory array includes storing a data signal in a memory cell. A precharge signal is received, and in response to the precharge signal, a reference input node of a trigger circuit and a data input node of a sense amplifier are precharged to a predetermined precharge level. In response to the reference input node falling from the predetermined precharge level to a triggering level, a triggering signal is output to the sense amplifier. The data signal is latched by the sense amplifier in response to the triggering signal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sense amplifier system, comprising:
   a precharge transistor connected between a power input terminal and a reference input node and having a gate terminal;
   a reference transistor connected between the reference input node and a ground terminal and having a second gate terminal;
   a NAND circuit having a first input terminal connected to the reference input node, a second input terminal connected to the power input terminal, and a trigger output terminal;
   wherein in a precharge phase, the precharge transistor is configured to receive a precharge signal via the gate terminal; and
   wherein in a sensing phase subsequent to the precharge phase, the NAND circuit is configured to output a triggering signal at the trigger output terminal in response to the reference input node reaching a triggering level.

2. The sense amplifier system of claim 1, further comprising one or more sense amplifiers coupled to the trigger output terminal, the one or more sense amplifiers configured to latch a received data signal in response to receiving the triggering signal.

3. The sense amplifier system of claim 2, wherein at least one sense amplifier of the one or more sense amplifiers includes a latch circuit having a trigger input terminal configured to receive the triggering signal, and a data input terminal configured to receive data signals.

4. The sense amplifier system of claim 2, wherein at least one sense amplifier of the one or more sense amplifiers includes a pulse generator circuit configured to output a pulse signal in response to receiving the triggering signal.

5. The sense amplifier system of claim 4, wherein the at least one sense amplifier of the one or more sense amplifiers includes an input circuit coupled to a memory cell and the pulse generator circuit, wherein the input circuit is configured to output a data signal from the memory cell in response to receiving the pulse signal.

6. The sense amplifier system of claim 1, wherein the triggering level is less than a precharge level.

7. The sense amplifier system of claim 1, wherein the precharge transistor is a p-channel metal-oxide semiconductor (PMOS) transistor.

8. The sense amplifier system of claim 1, wherein the reference transistor is configured to receive a word line signal via the second gate terminal.

9. The sense amplifier system of claim 1, wherein in the precharge phase, the precharge transistor precharges a data input node of a memory cell to a predetermined precharge level in response to the precharge signal.

10. The sense amplifier system of claim 9, wherein in the sensing phase, a voltage level of the data input node falls at a first rate based on a logic 0 being stored in the memory cell, or the voltage level of the data input node falls at a second rate based on a logic 1 being stored in the memory cell, wherein a voltage level of the reference input node falls at a third rate, the third rate between the first rate and the second rate.

11. A memory device, comprising:
    a memory cell configured to store data;
    a word line coupled to the memory cell and configured to receive a word line signal;
    a bit line coupled to the memory cell and configured to receive a data signal from the memory cell;
    a sense amplifier coupled to the bit line and configured to latch the data signal received on the bit line; and
    a sense amplifier control circuit, including:
       a precharge transistor connected between a power input terminal and a reference input node and having a gate terminal;
       a reference transistor connected between the reference input node and a ground terminal and having a second gate terminal;
       a NAND circuit having a first input terminal connected to the reference input node, a second input terminal connected to the power input terminal, and a trigger output terminal;
       wherein in a precharge phase, the precharge transistor is configured to receive a precharge signal via the gate terminal;
       wherein in a sensing phase subsequent to the precharge phase, the NAND circuit is configured to output a triggering signal at the trigger output terminal in response to the reference input node reaching a triggering level; and
       wherein the sense amplifier control circuit is coupled to the sense amplifier via the trigger output terminal.

12. The memory device of claim 11, wherein the sense amplifier includes:
    a latch circuit having a trigger input terminal configured to receive the triggering signal;
    a pulse generator circuit configured to output a pulse signal in response to the triggering signal; and
    an input circuit coupled to the memory cell and the pulse generator circuit and configured to output the data signal to the latch circuit in response to the pulse signal.

13. The memory device of claim 11, further comprising:
    one or more additional memory cells;
    one or more additional bit lines, each of the one or more additional memory cells coupled to a respective bit line of the one or more additional bit lines; and
    one or more additional sense amplifiers, wherein the sense amplifier control circuit is configured to output the triggering signal to the sense amplifier and the one or more additional sense amplifiers.

14. The memory device of claim 11, wherein in the precharge phase, the precharge transistor precharges a data input node of the memory cell to a predetermined precharge level in response to the precharge signal.

15. The memory device of claim 14, wherein in the sensing phase, a voltage level of the data input node falls at a first rate based on a logic 0 being stored in the memory cell, or the voltage level of the data input node falls at a second rate based on a logic 1 being stored in the memory cell, wherein a voltage level of the reference input node falls at a third rate, the third rate between the first rate and the second rate.

16. The memory device of claim 14, wherein the triggering level is less than the predetermined precharge level.

17. A method, comprising:
storing a data signal in a memory cell;
receiving a precharge signal;
in response to the precharge signal, precharging a reference input node of a trigger circuit and a data input node of a sense amplifier to a predetermined precharge level;
in response to the reference input node falling from the predetermined precharge level to a triggering level, outputting a triggering signal to the sense amplifier to cause the sense amplifier to latch the data signal;
wherein after precharging the reference input node, a voltage level of the data input node falls at a first rate based on the data signal comprising a logic 0, or the voltage level of the data input node falls at a second rate based on the data signal comprising a logic 1, and
wherein a voltage level of the reference input node falls at a third rate, the third rate between the first rate and the second rate.

18. The method of claim 17, further comprising outputting the triggering signal to one or more additional sense amplifiers.

19. The method of claim 17, wherein the trigger circuit includes a NAND circuit having a first input terminal coupled to the reference input node, a second input terminal configured to receive a power input signal, and a trigger output terminal configured to output the triggering signal.

20. The method of claim 17, wherein the trigger circuit includes an inverter circuit including a first input terminal coupled to the reference input node and a trigger output terminal configured to output the triggering signal.

* * * * *